(12) United States Patent  (10) Patent No.: US 7,570,876 B2
De Ridder  (45) Date of Patent: Aug. 4, 2009

(54) METHOD AND SYSTEM FOR LOADING SUBSTRATE SUPPORTS INTO A SUBSTRATE HOLDER

(75) Inventor: Christianus Gerardus Maria De Ridder, Hoogland (NL)

(73) Assignee: ASM International N.V. (NL)

( * ) Notice: Subject to any disclaimer, the term of this patent is extended or adjusted under 35 U.S.C. 154(b) by 0 days.

(21) Appl. No.: 11/669,842

(22) Filed: Jan. 31, 2007

(65) Prior Publication Data

US 2007/0122128 A1  May 31, 2007

Related U.S. Application Data

(63) Continuation of application No. 10/913,945, filed on Aug. 5, 2004, now Pat. No. 7,181,132.

(60) Provisional application No. 60/496,898, filed on Aug. 20, 2003.

(51) Int. Cl.
    *A21B 2/00* (2006.01)
    *C23C 16/00* (2006.01)
(52) U.S. Cl. .................. 392/416; 118/724; 118/725
(58) Field of Classification Search ........... 392/416, 392/417, 407, 419, 420; 118/724, 725
    See application file for complete search history.

(56) References Cited

U.S. PATENT DOCUMENTS

| | | |
|---|---|---|
| 3,210,455 A | 10/1965 | Sedlatschek |
| 3,466,079 A | 9/1969 | Mammel |
| 3,523,706 A | 8/1970 | Logue |
| 3,947,236 A | 3/1976 | Lasch, Jr. |
| 3,972,704 A | 8/1976 | Loxley et al. |
| 4,322,592 A | 3/1982 | Martin |

(Continued)

FOREIGN PATENT DOCUMENTS

EP    0 238 751 A2    9/1987

(Continued)

OTHER PUBLICATIONS

Provisional specification for 300-mm Front-opening Interface Mechanical Standard (FIMS), SEMI E62-0997, pp. 1-10 (1997).

(Continued)

*Primary Examiner*—Daniel L Robinson
(74) *Attorney, Agent, or Firm*—Knobbe Martens Olson & Bear LLP

(57) ABSTRACT

Wafer supports are provided that have a diameter smaller than the diameter of the wafer that they are to support in a wafer boat. The perimeter of the wafer support is preferably continuous, extending completely around in a 360° span, and is sized to fit between the protrusions supporting a particular wafer in a wafer cassette. To load the wafer boat, an end effector removes the wafer support from a wafer boat and moves the wafer support into a wafer cassette, where the end effector moves upward to seat a wafer upon the wafer support. The wafer and wafer support are then transported to the wafer boat and the wafer support and the wafer are lowered onto a wafer slot surface in a wafer slot in the wafer boat, to transfer the wafer support and wafer from the end effector to the wafer boat.

19 Claims, 4 Drawing Sheets

U.S. PATENT DOCUMENTS

| | | |
|---|---|---|
| 4,348,044 A | 9/1982 | Wood, III |
| 4,407,654 A | 10/1983 | Irwin |
| 4,468,259 A | 8/1984 | Mimura |
| 4,495,024 A | 1/1985 | Bok |
| 4,563,558 A | 1/1986 | Rhemer et al. |
| 4,575,408 A | 3/1986 | Bok |
| 4,586,743 A | 5/1986 | Edwards et al. |
| 4,738,748 A | 4/1988 | Kisa |
| 4,770,590 A | 9/1988 | Hugues et al. |
| 4,773,687 A | 9/1988 | Bush et al. |
| 4,781,411 A | 11/1988 | Kolb |
| 4,852,247 A | 8/1989 | Hawkswell |
| 4,860,687 A | 8/1989 | Frijink |
| 4,900,214 A | 2/1990 | Ben |
| 4,904,012 A | 2/1990 | Nishiguchi et al. |
| 4,913,481 A | 4/1990 | Chin et al. |
| 4,923,054 A | 5/1990 | Ohtani et al. |
| 4,971,512 A | 11/1990 | Lee et al. |
| 4,978,567 A | 12/1990 | Miller |
| 5,022,695 A | 6/1991 | Ayers |
| 5,028,195 A | 7/1991 | Ishii et al. |
| 5,071,485 A | 12/1991 | Matthews et al. |
| 5,093,550 A | 3/1992 | Gerber et al. |
| 5,110,248 A | 5/1992 | Asano et al. |
| 5,133,635 A | 7/1992 | Malin et al. |
| 5,162,047 A | 11/1992 | Wada et al. |
| 5,178,639 A | 1/1993 | Nishi |
| 5,192,371 A | 3/1993 | Shuto et al. |
| 5,219,079 A | 6/1993 | Nakamura |
| 5,310,339 A | 5/1994 | Ushikawa |
| 5,316,472 A | 5/1994 | Niino et al. |
| 5,334,257 A | 8/1994 | Nishi et al. |
| 5,407,449 A | 4/1995 | Zinger |
| 5,445,486 A | 8/1995 | Kitayama et al. |
| 5,482,558 A | 1/1996 | Watanabe et al. |
| 5,482,559 A | 1/1996 | Imai et al. |
| 5,492,229 A | 2/1996 | Tanaka et al. |
| 5,520,501 A | 5/1996 | Kouno et al. |
| 5,556,147 A | 9/1996 | Somekh et al. |
| 5,556,275 A | 9/1996 | Sakata et al. |
| 5,565,034 A | 10/1996 | Nanbu et al. |
| 5,592,581 A | 1/1997 | Okase |
| 5,664,925 A | 9/1997 | Muka et al. |
| 5,669,752 A | 9/1997 | Moon |
| 5,692,873 A | 12/1997 | Weeks et al. |
| 5,695,567 A | 12/1997 | Kordina et al. |
| 5,711,811 A | 1/1998 | Suntola et al. |
| 5,746,460 A | 5/1998 | Marohl et al. |
| 5,762,391 A | 6/1998 | Sumnitsch |
| 5,765,889 A | 6/1998 | Nam et al. |
| 5,788,425 A | 8/1998 | Skow et al. |
| 5,788,453 A | 8/1998 | Donde et al. |
| 5,820,367 A | 10/1998 | Osawa |
| 5,833,288 A | 11/1998 | Itasaka |
| 5,839,770 A | 11/1998 | Zajac, Jr. et al. |
| 5,851,041 A | 12/1998 | Anderson et al. |
| 5,858,103 A | 1/1999 | Nakajima et al. |
| 5,865,321 A | 2/1999 | Tomanovich |
| 5,879,459 A | 3/1999 | Gadgil et al. |
| 5,879,462 A | 3/1999 | Kordina et al. |
| 5,897,311 A | 4/1999 | Nishi |
| 5,931,518 A | 8/1999 | Pirker |
| 5,931,666 A | 8/1999 | Hengst |
| 5,974,682 A | 11/1999 | Akimoto |
| 5,981,966 A | 11/1999 | Honma |
| 5,983,906 A | 11/1999 | Zhao et al. |
| 5,984,607 A | 11/1999 | Oosawa et al. |
| 5,990,650 A | 11/1999 | Brock |
| 6,034,000 A | 3/2000 | Heyder et al. |
| 6,062,853 A | 5/2000 | Shimazu et al. |
| 6,068,441 A | 5/2000 | Raaijmakers et al. |
| 6,099,302 A | 8/2000 | Hong et al. |
| 6,109,677 A | 8/2000 | Anthony |
| 6,111,225 A | 8/2000 | Ohkase et al. |
| 6,152,677 A | 11/2000 | Tateyama et al. |
| 6,158,951 A | 12/2000 | Carr et al. |
| 6,167,322 A | 12/2000 | Holbrooks |
| 6,168,668 B1 | 1/2001 | Yudovsky |
| 6,183,183 B1 | 2/2001 | Goodwin et al. |
| 6,189,943 B1 | 2/2001 | Manpuku et al. |
| 6,203,617 B1 | 3/2001 | Tanoue et al. |
| 6,204,194 B1 | 3/2001 | Takagi |
| 6,216,883 B1 | 4/2001 | Kobayashi et al. |
| 6,244,641 B1 | 6/2001 | Szapucki et al. |
| 6,279,976 B1 | 8/2001 | Ball |
| 6,280,183 B1 | 8/2001 | Mayur et al. |
| 6,287,112 B1 | 9/2001 | Van Voorst Vader et al. |
| 6,321,680 B2 | 11/2001 | Cook et al. |
| 6,322,116 B1 | 11/2001 | Stevens |
| 6,331,023 B1 | 12/2001 | Goodwin et al. |
| 6,341,935 B1 | 1/2002 | Tseng |
| 6,347,919 B1 | 2/2002 | Ryan et al. |
| 6,361,313 B1 | 3/2002 | Beyaert et al. |
| 6,368,049 B1 | 4/2002 | Osaka et al. |
| 6,375,403 B1 | 4/2002 | Mages et al. |
| 6,390,753 B1 | 5/2002 | De Ridder |
| 6,399,922 B2 | 6/2002 | Okase et al. |
| 6,409,453 B1 | 6/2002 | Brodine et al. |
| 6,462,411 B1 | 10/2002 | Watanabe et al. |
| 6,464,445 B2 | 10/2002 | Knapik et al. |
| 6,559,039 B2 | 5/2003 | Wang et al. |
| 6,753,506 B2 | 6/2004 | Liu et al. |
| 6,896,738 B2 | 5/2005 | Sumakeris et al. |
| 7,077,912 B2 * | 7/2006 | Park et al. .................. 118/725 |
| 2002/0071756 A1 | 6/2002 | Gonzalez |
| 2002/0182892 A1 | 12/2002 | Arai et al. |
| 2003/0180125 A1 | 9/2003 | Van den Berg et al. |
| 2004/0023495 A1 * | 2/2004 | Butterfield et al. .......... 438/692 |
| 2004/0040632 A1 | 3/2004 | Oosterlaken |

FOREIGN PATENT DOCUMENTS

| | | |
|---|---|---|
| EP | 0 405 301 A2 | 1/1991 |
| EP | 0 560 439 A1 | 5/1993 |
| EP | 0 821 403 A2 | 1/1998 |
| EP | 1 615 261 A1 | 1/2006 |
| GB | 2 199 022 A | 6/1988 |
| JP | 61-247678 | 11/1986 |
| JP | 63-102225 | 5/1988 |
| JP | 63-136532 | 6/1988 |
| JP | 10-053489 | 2/1998 |
| JP | 10-163297 | 6/1998 |
| JP | 10-321543 | 12/1998 |
| JP | 2001-176808 | 6/2001 |
| JP | 2002-033284 | 1/2002 |
| WO | WO 98/01890 | 1/1998 |
| WO | WO 98/38672 | 9/1998 |
| WO | WO 99/18601 | 4/1999 |
| WO | WO 00/68977 | 11/2000 |

OTHER PUBLICATIONS

"Asyst Axys 407 Class 1 Robot," Asyst Technologies, Inc. (Mar. 2000).
"Asyst Model 53 Robot," Asyst Technologies, Inc. (2002).
"4.5 Vacuum Robot," Asyste Technologies, Inc. (2002).
"Provisional mechanical specification for a 300 mm single-wafer box system that emulates a foup," SEMI E103-1000 2000, pp. 1-4.
"Edge Gripping End-Effector," www.ideworld.com, (Jul. 24, 2002).

* cited by examiner

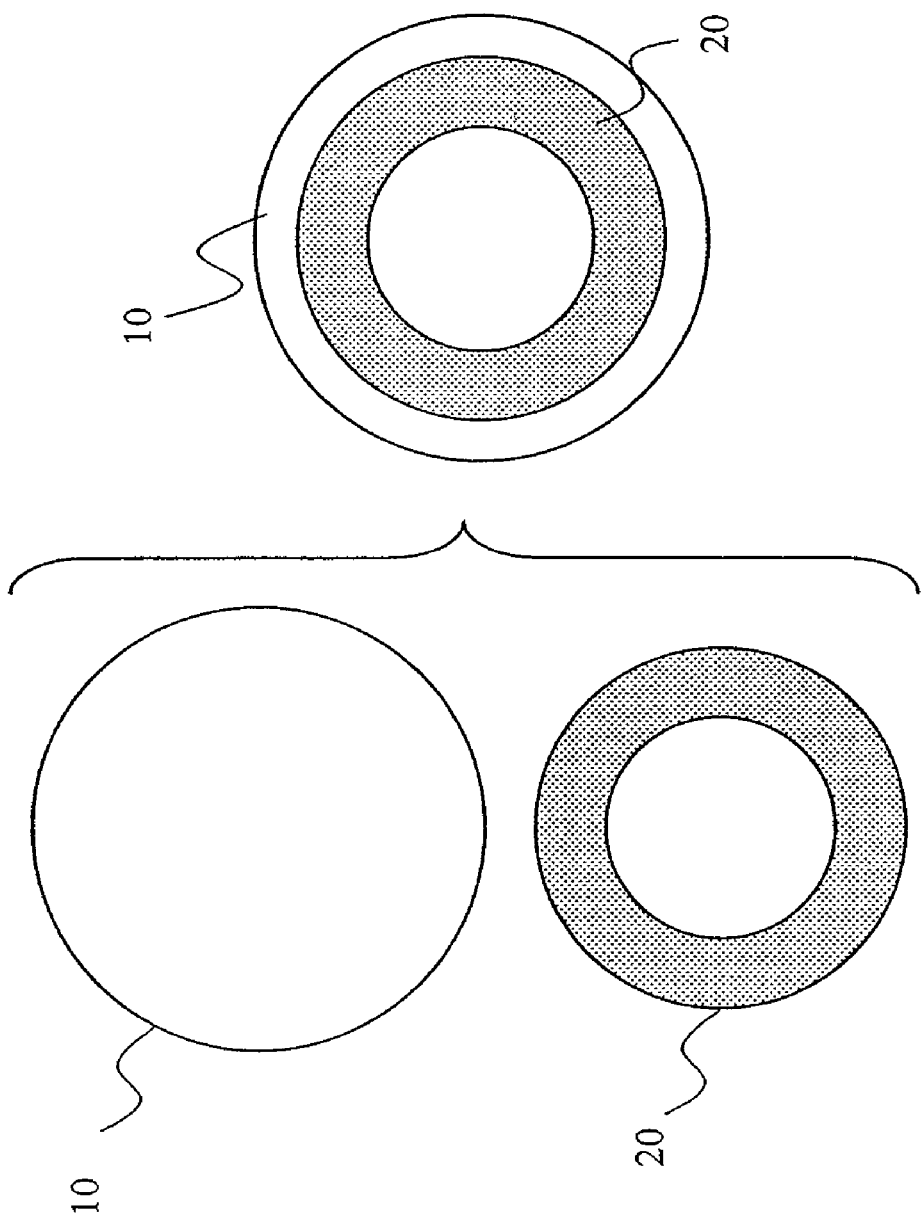

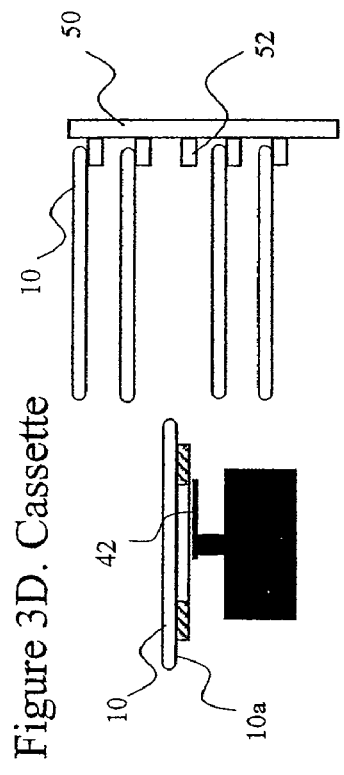
Figure 3A. Boat
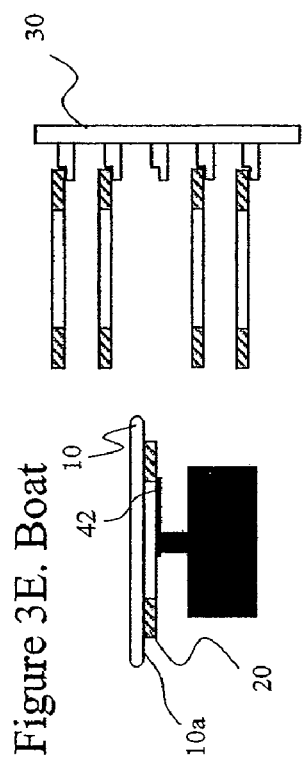
Figure 3B. Boat
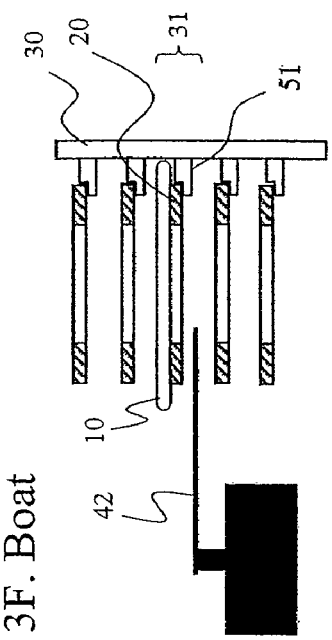
Figure 3C. Cassette
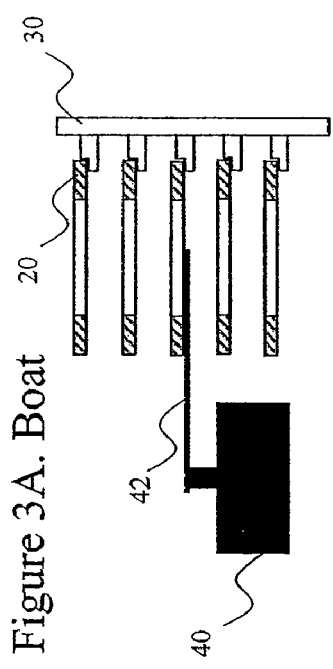
Figure 3D. Cassette
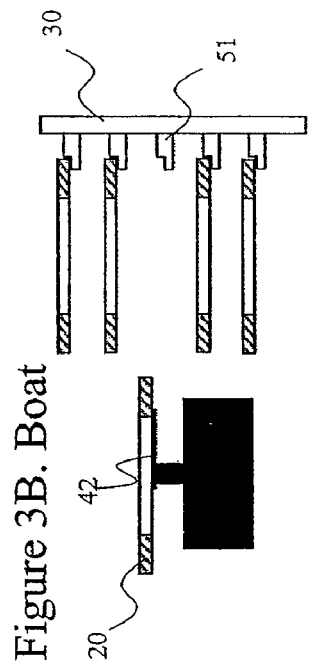
Figure 3E. Boat
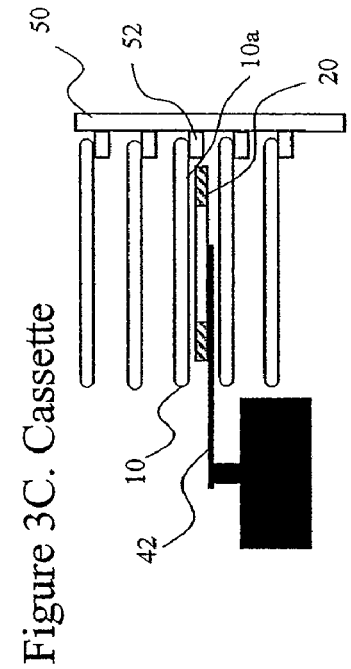
Figure 3F. Boat

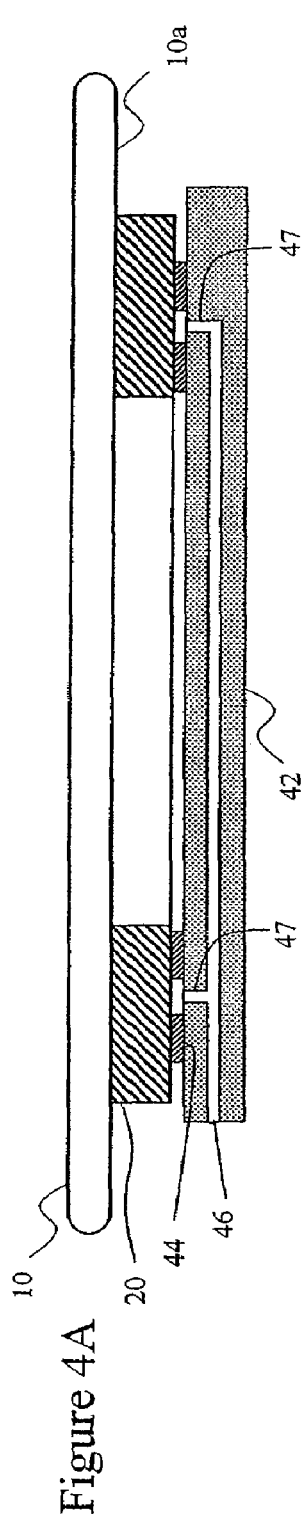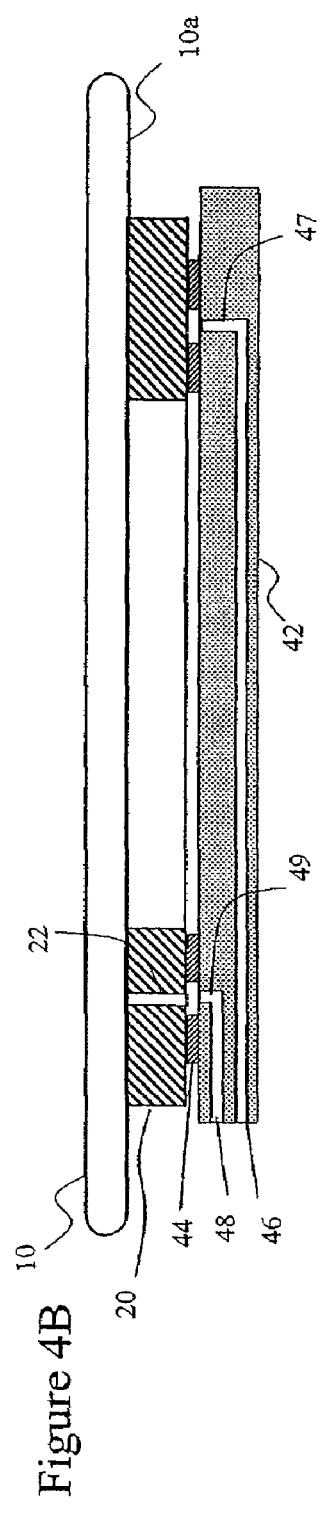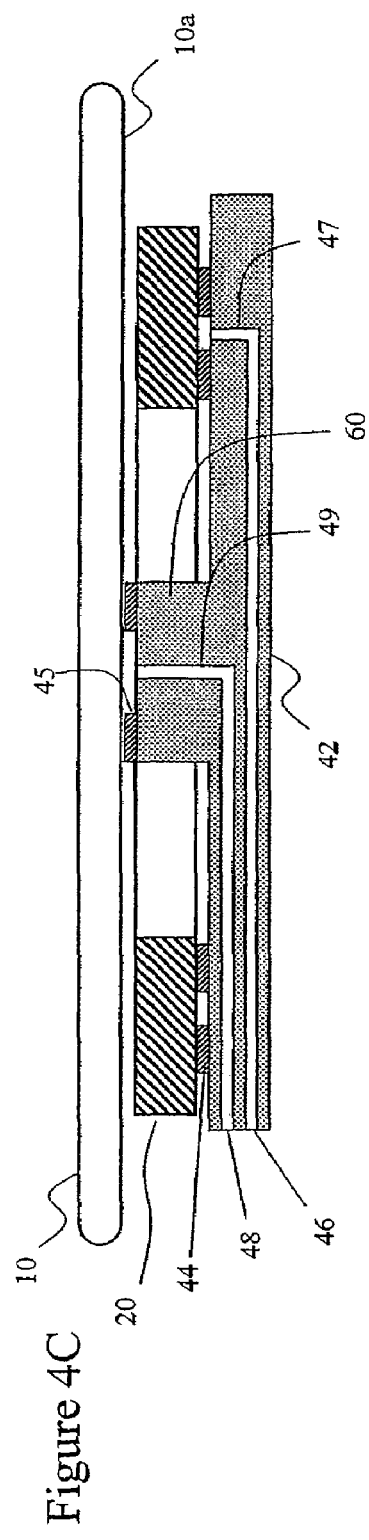

METHOD AND SYSTEM FOR LOADING SUBSTRATE SUPPORTS INTO A SUBSTRATE HOLDER

PRIORITY CLAIM

This application is a continuation of U.S. patent application Ser. No. 10/913,945, filed Aug. 5, 2004, which claims the priority benefit under 35 U.S.C. §119(e) of provisional Application No. 60/496,898, filed Aug. 20, 2003.

REFERENCE TO RELATED APPLICATIONS

This application is related to, and hereby incorporates by reference in their entireties, the following: U.S. patent application Ser. No. 10/636,372, filed Aug. 7, 2003; U.S. patent application Ser. No. 10/390,574, filed Mar. 13, 2003 (now U.S. Pat. No. 6,835,039); U.S. patent application Ser. No. 10/361,480, filed Feb. 5, 2003 (now U.S. Pat. No. 7,104,578); U.S. patent application Ser. No. 10/406,801, filed Apr. 2, 2003 (now U.S. Pat. No. 7,033,126); and U.S. Pat. No. 6,582,221, issued Jun. 24, 2003.

BACKGROUND OF THE INVENTION

1. Field Of The Invention

This invention relates generally to semiconductor fabrication and, more particularly, to a method and apparatus for loading or unloading a substrate holder that accommodates a plurality of semiconductor substrates.

2. Description of the Related Art

A substrate holder, such as a wafer boat or rack, is typically used to hold a plurality of semiconductor substrates, such as wafers, for processing in a conventional vertical heat treatment apparatus. The wafer boat commonly comprises a plurality of support accommodations that support the wafers at edge portions of those wafers. In this way, the wafers are held oriented horizontally in a vertically spaced-apart manner. In general, wafers are automatically loaded from a wafer container into a boat using a generic wafer handler, including an end effector for interfacing with the wafer, by contacting the wafer at its backside, or bottom surface.

Heat-related complications, however, can preclude the use of common wafer boats for very high temperature treatment or processing of a batch of wafers in a furnace, e.g., processing at temperatures up to about 1350° C. For example, due to the limited mechanical strength of the wafer at high temperatures, the wafer's own weight can cause it to plastically deform at very high temperatures because common wafer boats support wafers only at their edges.

Wafer boat wafer supports using other arrangements for supporting wafers are described in U.S. Pat. Nos. 5,865,321 and 5,820,367. U.S. Pat. No. 5,865,321 describes a wafer boat having a wafer support with multiple inwardly extending arms to support the wafer at more inward locations. U.S. Pat. No. 5,820,367 describes a wafer boat that supports a wafer at a central location using the entire circumference of a ring support. The supports in these wafer boats, however, are still not sufficiently supportive to prevent plastic deformation and consequent crystallographic slip of the wafer.

Wafer supports for single wafer systems can each support a substantial portion of the bottom surface area of a wafer and do not suffer from crystallographic slip to the same degree as wafers in conventional wafer boats. For such single wafer systems, susceptors supporting wafers over their entire bottom surface area and support rings forming a complete circle to support a wafer at its perimeter are known. Special measures, however, are required to place a wafer onto or to separate a wafer from such susceptors.

In particular, with such a single wafer system, when using a robot end effector, access to the wafer is generally provided from the bottom and the susceptor stays in place within a process chamber while wafers are serially loaded and unloaded. Typically, the robot end effector places a wafer on moveable pins at a level above the susceptor, the wafer being spaced sufficiently above the susceptor to allow enough clearance for retracting the robot end effector without the robot end effector touching the wafer or the susceptor. After retraction, the pins move downward to lower the wafer onto the susceptor. To unload the wafer, the reverse of these steps occurs. While suitable for single wafer processing, such a wafer loading and support system is not easily applicable to a batch processing system because, if possible at all, such a system would be unacceptably complicated and cumbersome, since it would require, inter alia, that every processing position be provided with moveable pins and the attendant hardware and control systems to move these pins.

Accordingly, there is a need for substrate holder systems and loading methods that, inter alia, provide improved support for substrates and that allow for efficient loading and unloading of the substrates for processing in a process chamber.

SUMMARY OF THE INVENTION

According to one aspect of the invention, a method is provided for loading a wafer into a wafer boat. The method comprises providing the wafer in a wafer cassette and a wafer support in a wafer support holder. A robot end effector is inserted into the wafer support holder to remove a wafer support with the wafer support resting on the robot end effector. The wafer support is positioned below the wafer in the wafer cassette using the robot end effector so that the wafer support is parallel to and co-axially aligned with the wafer. The robot end effector is vertically moved relative to the wafer cassette to seat the wafer onto the wafer support or onto a surface of the end effector. The robot end effector is transferred, while holding the wafer support and the wafer, to the wafer boat. The robot end effector is vertically moved relative to the wafer boat to place the wafer support on an accommodation of the wafer boat so that the wafer rests on the wafer support.

According to another aspect of the invention, a system is provided for loading a wafer into a wafer boat. The system comprises an end effector having an opening for generating a vacuum at an upper surface of the end effector. The system also comprises a wafer support having a passage configured to align with the upper surface opening. The passage is configured to generate a vacuum suction at an interface of the wafer support and a wafer upon retention of the wafer support on the end effector and upon retention of the wafer on the wafer support.

According to yet another aspect of the invention, a method is provided for loading a plurality of substrates into a substrate holder for semiconductor processing. The method comprises providing a substrate resting on a substrate edge support structure and providing a substrate support seated upon an end effector. The substrate support is positioned below the substrate and the end effector is moved upwardly to contact the substrate with the substrate support and to seat the substrate upon the substrate support. The end effector is translated to position the substrate and the substrate support seated upon the end effector into the substrate holder. The end effector is moved downwardly to seat the substrate support upon a support surface for supporting substrate supports in the substrate holder.

According to another aspect of the invention, a wafer support for supporting a wafer during semiconductor processing is provided. The wafer support comprises a substantially flat bottom major surface, a substantially flat top major surface parallel to the bottom major surface and a continuous outer sidewall connecting the top and the bottom major surfaces. The longest dimension of the top and bottom surfaces is sized for the wafer support to fit coplanar with and between coplanar edge supports for supporting the wafer in a cassette. The longest dimension of the top and bottom surfaces is also sized for the wafer support to rest upon one or more horizontal extensions for holding the wafer support in a wafer boat during processing.

According to another aspect of the invention, a wafer support for supporting a wafer during semiconductor processing is provided. The wafer support comprises a substantially flat bottom major surface, a substantially flat top major surface parallel to the bottom major surface and a continuous outer sidewall connecting the top and the bottom major surfaces. The longest dimension of the top and bottom surfaces is sized for the wafer support to fit coplanar with and between coplanar edge supports for supporting the wafer in a cassette. The longest dimension of the top and bottom surfaces is also sized for the wafer support to rest upon one or more horizontal extensions for holding the wafer support in a wafer boat during processing.

According to yet another aspect of the invention, a system for loading a semiconductor wafer into a wafer boat is provided. The system comprises an end effector having a gas channel configured to generate a vacuum suction at an interface with an overlying object. A wafer support is configured to rest upon the end effector and to support an overlying wafer during semiconductor processing. The wafer support is sized to fit coplanar with and between edge supports supporting the wafer in a wafer transport cassette.

BRIEF DESCRIPTION OF THE DRAWINGS

The invention will be better understood from the detailed description of the preferred embodiments and from the appended drawings, which are meant to illustrate and not to limit the invention, and wherein:

FIG. 2 shows schematic top views of a wafer and a wafer support, individually and superimposed, according to preferred embodiments of the invention;

FIGS. 3A-3F are schematic cross-sectional side views showing a process for loading a wafer onto a wafer support and into a wafer boat, according to preferred embodiments of the invention; and FIGS. 4A-4C are schematic cross-sectional side views showing different end effector configurations suitable for use in preferred embodiments of the invention.

DETAILED DESCRIPTION OF THE PREFERRED EMBODIMENTS

Figure 1:
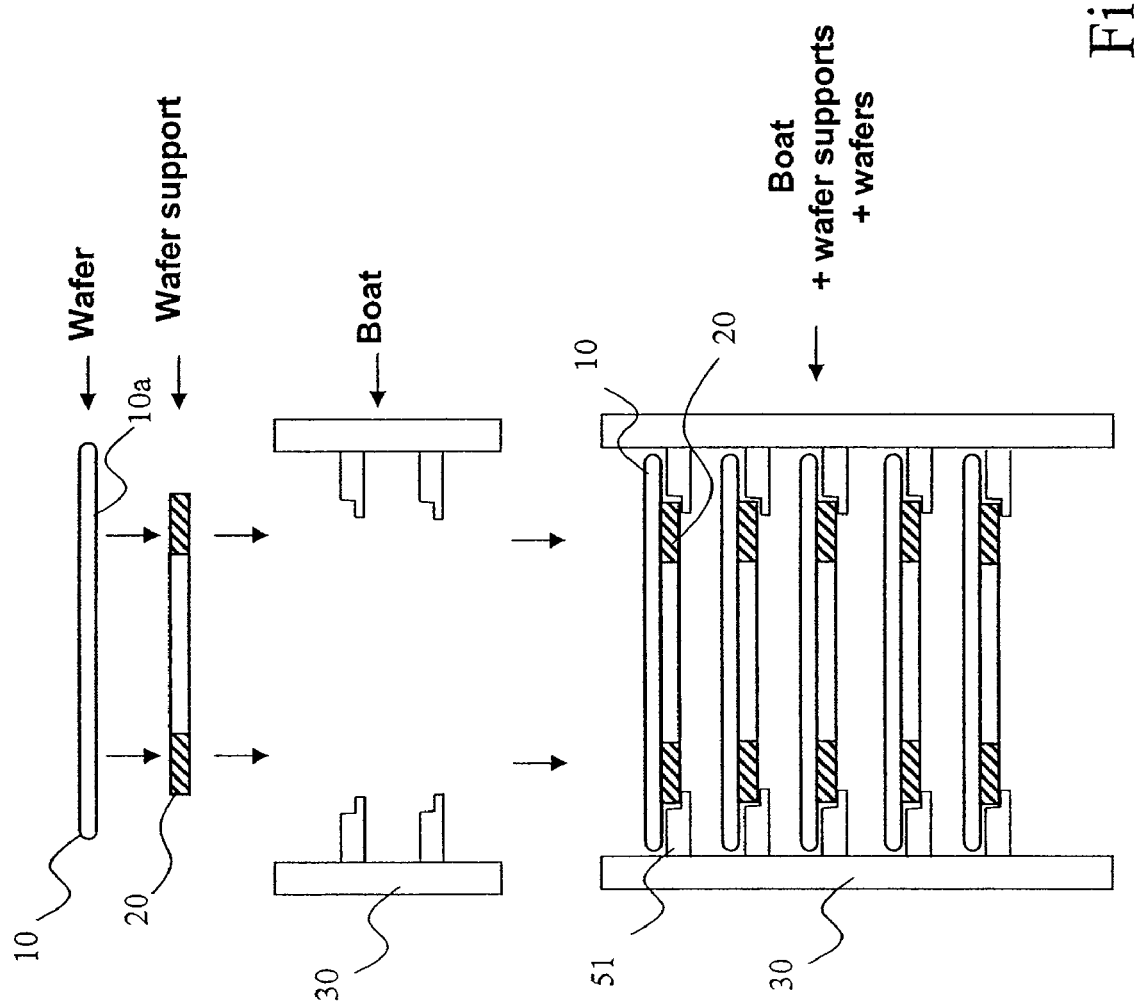
FIG. 1 is a schematic cross-sectional side view of the loading and support of a wafer on a wafer support in a wafer boat, according to preferred embodiments of the invention.

Various systems and methods having wafer supports that support a substantial portion of the bottom surface areas of a wafer have been proposed. Some of these wafer support and wafer boat loading schemes utilize wafer supports that are plates or rings. For example, according to one scheme discussed in U.S. patent application Ser. No. 10/390,574, filed on Mar. 13, 2003, a wafer support and a wafer are transferred to a transfer station where the wafer is placed on the wafer support. The wafer support, holding the wafer, is transferred to and inserted into an accommodation of the wafer boat. According to another scheme discussed in U.S. patent application Ser. No. 10/406,801, filed Apr. 2, 2003, the wafers are loaded onto the accommodations of a receiver frame, coaxially aligned with the wafer boat. The wafers are then seated onto the wafer supports of the wafer boat by vertically moving the wafer boat relative to the receiver frame.

It has been found that, depending on the particular requirements of a process, both of these schemes have particular disadvantages. A disadvantage of the method utilizing a transfer station is that it is rather time consuming, which is not a problem for long semiconductor fabrication processes but seriously affects the throughput of processes having a short or medium range duration. A disadvantage of the method using a receiver frame is that a larger wafer pitch, or spacing between wafers in a wafer boat, is needed to facilitate the wafer handling.

The preferred embodiments of the present invention avoid these disadvantages to advantageously provide a system and method to load substrates, such as wafers, onto a substrate holder, such as a wafer boat, comprising substrate supports (e.g., support plates or rings) that is quick and that does not require a large wafer pitch.

According to preferred embodiments of the invention, substrate supports are provided that have a diameter smaller than the diameter of the substrate that they are to support. These substrate supports can support substrates over a significant portion of their bottom surface areas and can be removably accommodated in slots of a wafer boat or other structure for holding a plurality of substrates.

To load substrates into a substrate holder, an end effector contacts and removes a substrate support from a substrate support holder storing the substrate support. The end effector then moves the substrate support to a cassette or any other structure, such as a buffer station or racks in a load lock, holding a substrate. The substrate is preferably supported inside the cassette or other structure by an edge support structure that contacts the substrate proximate the substrates edge. The end effector aligns the substrate support under the substrate and the substrate support is moved relative to the substrate to contact the substrate, so that the substrate becomes seated upon the substrate support. The substrate support, having a substrate upon it, is then transported out of the cassette and into the substrate holder. After transporting the substrate and substrate support to the substrate holder, the end effector is removed from the substrate holder.

Preferably, the substrate support holder storing the substrate supports is the substrate holder which holds the substrates and substrate support supports during processing. It will be appreciated, however, that the substrate supports can also be stored in a substrate support holder other than the substrate holder used during semiconductor processing.

In some preferred embodiments, the end effector has holes or gas passages which provide a vacuum suction force to the bottom of the substrate support, to stably transport the substrate support and prevent slippage. In addition, the end effector can have a part that extends to the substrate to also provide a vacuum suction directly to the substrate to further stabilize the substrate for transport. In another embodiment, the substrate support can have passages within it to transfer a suction force generated by the end effector directly to a substrate seated upon the substrate support.

Reference will now be made to the Figures, wherein like numerals refer to like parts throughout.

In FIG. 1, a wafer 10 and a wafer support 20 having a diameter smaller than the wafer are shown. A wafer boat 30 accommodates the wafer supports 20 and the wafers 10 such that the wafers 10 are fully supported by the wafer supports 20 and do not have direct contact with the wafer boat 30 itself.

In FIG. 2 top views of wafer 10 and wafer support 20, separated and superimposed, are shown. The outer diameter of wafer support 20 is smaller than the diameter of wafer 10. While the wafer support is shown having the shape of an annular ring with an open area in the center region, it can have a different shape so long as the wafer support is sized to not extend to the periphery of the wafer. For example, the wafer support can be a plate, grid, or mesh structure, or the outer periphery can deviate from a circular shape. Preferably, the wafer support 20 preferably extends continuously around the wafer 10 over a 360° span, so that while not extending to the wafer 10's outer perimeter, the wafer support 20 does provide support substantially along a continuous line adjacent and inset from the outer perimeter of the wafer 10. Moreover, the wafer support 20 is sized to fit within the unsupported area on the bottom 10a of the wafer 10, i.e., the wafer support 20 fits within the space not obstructed by a wafer cassette projection 52 (FIG. 3) for supporting a wafer 10 in the cassette 50.

FIGS. 3A to 3F show schematically a process for loading a wafer 10 on a wafer support 20 into the wafer boat 30. The wafer support 20 is preferably sized so that it does not contact parts of the wafer cassette 50 that support wafers 10. Preferably, the wafer support 20 has a width that is smaller than a width of an unsupported area of the wafer 10 in the wafer cassette 50, e.g., the wafer supports 20 have a diameter smaller than the diameter of an area made out by the inner edges of coplanar support shelves 52. The wafer support 30, however, preferably is wide enough so that the wafer support 30 can rest on the boat shelves 51 after being loaded into the wafer boat 50. Preferably, the wafer support 20 has a diameter that allows it to extend beyond the inner edge of the wafer boat support shelves 52.

In FIG. 3A, wafer boat 30 accommodates wafer supports 20. End effector 42 of robot 40 moves below a wafer support 20 and moves vertically in an upward direction to contact the wafer support 20 so that the wafer support 20 is seated on the end effector 42. In FIG. 3B, the end effector has removed the wafer support 20 out of the wafer boat 30. In FIG. 3C, the end effector 42 with the wafer support 20 on it has moved to a position below a wafer 10 in a wafer cassette 50. The end effector 42 then moves vertically in an upward direction until the wafer support 20 contacts the wafer 10. Because of the small size of the wafer support 20, this can be done without the wafer support 20 touching the support shelves 52 of the wafer cassette 50. FIG. 3D shows that the end effector 42, holding wafer support 20 and wafer 10, has been retracted from wafer cassette 50. In FIG. 3E, the end effector 42 has moved towards wafer boat 30 and in FIG. 3F the end effector has placed wafer support 20 with wafer 10 into an accommodation or wafer slot 31 of wafer boat 30.

After loading the wafers 10, the wafer boat 30 is preferably loaded into a processing chamber (not shown), in which the wafers can be subjected to a semiconductor fabrication process. Advantageously, the semiconductor fabrication process can be a heat treatment at very high temperatures, e.g., about 1000° C. or above and up to about 1350° C. in some embodiments. After the heat treatment, it will be appreciated that unloading proceeds in a sequence reversed relative to that shown in FIG. 3.

Preferably, wafer supports 20 are stored in the wafer boat 30 and are only removed from the wafer boat 30 for the purpose of wafer transfer, e.g., transferring the wafers 10 back and forth between the cassettes 50 and the wafer boats 30. Such an arrangement is advantageously efficient by minimizing the amount of movement and distance that the end effector 42 must travel to transfer a wafer 10. Thus, the end effector 42 need only move between the wafer boat 30 and the cassette 50; movement to a third location housing the wafer supports 20 is unnecessary in such an arrangement. Alternatively, however, it is possible to provide one or more storage cassettes for wafer supports 20 in which the wafer supports 20 are stored when not in use. In that case, at the start of the loading sequence wafer supports 20 are picked-up from the wafer support storage cassette instead of from the wafer boat 30.

It will also be appreciated that various end effectors known in the art may be used to transport the wafer support 20 and the wafers 10, so long as the end effector is sized and shaped to fit between slots in the wafer support holder (e.g., wafer boat 30 or a separate storage) and wafer cassette 50 that contain the wafer supports 20 and the wafers 10.

Exemplary end effectors for transporting the wafer supports 20 and wafers 10 are shown in FIG. 4. In FIG. 4A, end effector 42 comprises at its top surface contact pads 44 to contact wafer support 20. These pads 44 are preferably of a non-particle generating material such as Teflon (polytetrafluoroethylene), PEEK™ (poly-ether-ether-ketone) or any other material known in the art to be suitable for this purpose.

In addition, the end effector transporting the wafer support 20 and the wafers 10 is preferably provided with a mechanism for holding the wafer support 20 upon the end effector, especially while the end effector moves during transport functions. Such a mechanism may include, for example, pins, grooves, or other matching patterns of protrusions and indentations on the wafer support and the end effector surface, respectively, that can mechanically prevent movement of a wafer support seated upon the end effector.

In the illustrated embodiments, the mechanism for preventing slippage of the wafer support is vacuum suction applied by the end effector. For example, as illustrated in FIG. 4A, the end effector 42 is preferably provided with one or more horizontal channels 46, in communication with one or more vertical channels 47. The vertical channel(s) 47 open up in a space delimited by the pad(s) 44, the wafer support 20 and the upper surface of the end effector 42. By applying a vacuum to the channel(s) 46, vacuum is applied to the lower surface of the support ring 20 and prevents it from moving during horizontal movement of the end effector 42.

In addition to the frictional forces between the wafer 10 and the wafer support 20 which act to prevent movement of the wafer 10 on the wafer support 20, preferably, wafer 10 is also actively prevented from moving during horizontal movement of end effector 42. An exemplary configuration for achieving this is shown in FIG. 4B. In this embodiment, wafer support 20 is provided with a vertically-extending passage 22. Horizontal channel 48 is in communication with vertical channel 49, which is in turn aligned with and in communication with through passage 22. Thus, applying a vacuum to channel 48 results in a vacuum to the lower surface of wafer 10. While the passage 22 can be connected to the gas channel 46, preferably, separate vacuum channels 46 and 47 are provided so that vacuum suction applied to the wafer support 20 and the wafer 10 can be varied independently of each other as desired. For example, vacuum suction can be applied to wafer support 20 alone, while transferring a wafer support 20 without a wafer 10, or to wafer support 20 and wafer 10 simultaneously while transferring a wafer support 20 holding a wafer 10.

In addition, it will be appreciated that through passage 22 need not be circular and can be any cross-sectional shape, so long as it extends through the wafer support 20. For example, it may take the form of a slit. In addition, the through passage 22 may have a larger size opening than the channel 49, or the channel 49 may have a larger size opening than the through passage 22, so that slight misalignments of the channel 49 and the through passage 22 do not significantly adversely affect the vacuum applied to the wafer 10. Moreover, for aligning the channel 49 and the through passage 22, matching indentations and protrusions on the wafer supports 10 and the end effector 42, or the on the wafer support holder, e.g., the wafer 30, and the wafer support 20, can be utilized to fix the position of the wafer support and the end effector in a pre-determined, fixed orientation relative to one another.

Yet another end effector configuration for providing vacuum suction to the wafer support 10 is shown in FIG. 4C. As illustrated, the end effector 42 is provided with a vertically upwardly extending part 60, preferably positioned to align with the center of the wafer 10. The part 60 is provided with a pad 45 for contacting the wafer 10. During transfer of a wafer 10 by the end effector 42, the wafer 10 is not supported on the wafer support 20 but on the central part 60 of the end effector 42 instead. In this embodiment, the central part 60 is provided with a vertical vacuum channel 49, in communication to a horizontal vacuum channel 48, to be able to apply vacuum to the lower surface 10a of the wafer 10. For placing the wafer support 20 and the wafer 10 in the wafer boat 30, the end effector 42 moves vertically downward. First, the wafer support 20 is contacted by the wafer boat 30 and lifted-off from the end effector 42 as the end effector 42 is moved downward. By further moving end effector 42 downward, wafer 10 contacts wafer support 20 and is lifted-off from end effector 42.

While the configuration shown in FIG. 4C advantageously holds the wafer 10 securely, in some circumstances other end effector configurations, such as shown in FIG. 4B, may be preferred, since the vertically extending central portion of end effector 42 adds to its overall height. This, in turn, increases the minimum spacing required between slots for wafers 10 and/or wafer supports 20 in any of the wafer support holders, cassettes or boats with which the end effector 42 is used. In particular, when using the end effector configuration shown in FIG. 4C, the wafer pitch of the wafer boat preferably is increased relative to an arrangement using the end effector illustrated in FIG. 4B.

As noted above, it will be understood that the application of vacuum grip is not an absolute requirement. Other methods of preventing movement of wafer support and wafer during movement of the end effector are possible. Such methods include applying a limited acceleration of the end effector, applying materials with a high resistance against sliding, such as haptic materials, and electrostatic clamping of the wafer support and/or the wafer. Moreover, various combinations of the vacuum grip, e.g., for holding the wafer, and these other methods, e.g., for holding the wafer support, are also possible.

Accordingly, various other modifications, omissions and additions may be made to the methods and structures described above without departing from the scope of the invention. All such modifications and changes are intended to fall within the scope of the invention, as defined by the appended claims.

I claim:

1. A system for loading a semiconductor wafer into a wafer boat, comprising:
    a robot end effector configured to support a wafer support;
    a wafer support configured to rest upon the robot end effector and to support an overlying semiconductor wafer during semiconductor processing; and
    a wafer transport cassette having edge supports sized and shaped to support the wafer inside the wafer cassette, wherein the edge supports are coplanar with each other and extend inwardly in the wafer transport cassette with innermost tips of the edge supports defining an open volume, wherein a longest dimension of a major surface of the wafer support is sized to allow the wafer support to fit in the open volume coplanar with the edge supports.

2. The system of claim 1, further comprising a wafer boat, wherein the wafer support is sized to rest upon one or more horizontal extensions in the wafer boat for holding the wafer support during processing.

3. The system of claim 1, wherein the robot end effector has a gas channel configured to generate a vacuum suction at an interface with the wafer support.

4. The system of claim 3, wherein the wafer support comprises a passage configured to align with the gas channel, wherein the passage is configured to produce a vacuum suction at an interface of the wafer support and the wafer upon retention of the wafer support on the robot end effector and upon retention of the wafer on the wafer support.

5. The system of claim 1, wherein the wafer support has a circular shape.

6. The system of claim 1, wherein tips of the edge supports extending into an interior of the transport cassette delimit a circle having a diameter larger than a diameter of the wafer support.

7. The system of claim 5, wherein the wafer support is an annular ring having a central opening.

8. The system of claim 7, wherein the opening is circular.

9. The system of claim 7, wherein the robot end effector further comprises an upwardly extending part sized and positioned to extend through the opening to contact a bottom surface of the wafer.

10. The system of claim 9, wherein the upwardly extending part has a channel opening for generating a vacuum suction between the upwardly extending part and the bottom surface.

11. The system of claim 10, wherein the upwardly extending part supports the wafer at a level above the wafer support.

12. The system of claim 10, further comprising an other independently controllable gas channel having an opening at an end effector interface with the wafer support, wherein the other gas channel is configured to generate a vacuum at the end effector interface.

13. The system of claim 9, wherein the upwardly extending part further comprises pads for contacting the bottom surface.

14. The system of claim 13, wherein the pads comprise a non-particle generating material.

15. The system of claim 14, the material comprises polytetrafluoroethylene.

16. The system of claim 15, the material comprises polyether-ether-ketone.

17. The system of claim 1, wherein the wafer support comprises:
    a substantially flat bottom major surface;
    a substantially flat top major surface parallel to the bottom major surface; and
    a continuous outer sidewall connecting the top and the bottom major surfaces, wherein a longest dimension of the top and bottom surfaces is less than about 280 mm.

18. The wafer support of claim 17, wherein the wafer is a 300 mm wafer.

19. The wafer support of claim 17, wherein the innermost tips of the edge supports delimit a circle having a diameter less than about 290 mm.

* * * * *

UNITED STATES PATENT AND TRADEMARK OFFICE
CERTIFICATE OF CORRECTION

| | | |
|---|---|---|
| PATENT NO. | : 7,570,876 B2 | Page 1 of 1 |
| APPLICATION NO. | : 11/669842 | |
| DATED | : August 4, 2009 | |
| INVENTOR(S) | : Christianus Gerardus Maria De Ridder | |

It is certified that error appears in the above-identified patent and that said Letters Patent is hereby corrected as shown below:

On page 4, Col. 3, line 4, Below "holder." insert as a new paragraph --According to another aspect of the invention, a method is provided for loading a batch of substrates from one or more substrate cassettes into a substrate holder. The method comprises providing substrate supports having an outer dimension smaller than the dimension of an unsupported area of a substrate in the substrate cassette. A robot end effector is transferred, while holding a substrate support, to a position below a substrate in the substrate cassette such that the substrate support is parallel to the substrate and aligned with the unsupported area of the substrate. The robot end effector is moved vertically in an upward direction until the substrate is seated onto the substrate support or on the end effector. The robot end effector is transferred with the substrate support and the substrate to the substrate holder. The substrate support together with the substrate is placed in an accommodation of the substrate holder.--

On page 4, Col. 3, line 17-29, Below "processing." delete the paragraph "According to another ... during processing."

Signed and Sealed this

Eighteenth Day of September, 2012

David J. Kappos
*Director of the United States Patent and Trademark Office*